(12) United States Patent
Hung et al.

(10) Patent No.: US 10,146,141 B2
(45) Date of Patent: Dec. 4, 2018

(54) LITHOGRAPHY PROCESS AND SYSTEM WITH ENHANCED OVERLAY QUALITY

(71) Applicant: Taiwan Semiconductor Manufacturing Company, Ltd., Hsin-Chu (TW)

(72) Inventors: Chi-Cheng Hung, Miaoli County (TW); Wei-Liang Lin, Hsinchu (TW); Yung-Sung Yen, Taipei County (TW); Chun-Kuang Chen, Hsinchu Hsien (TW); Ru-Gun Liu, Hsinchu County (TW); Tsai-Sheng Gau, Hsinchu (TW); Tzung-Chi Fu, Miaoli County (TW); Ming-Sen Tung, Hsin-Chu (TW); Fu-Jye Liang, Hsinchu County (TW); Li-Jui Chen, Hsinchu (TW); Meng-Wei Chen, Taichung (TW); Kuei-Shun Chen, Hsinchu (TW)

(73) Assignee: TAIWAN SEMICONDUCTOR MANUFACTURING COMPANY, LTD., Hsin-Chu (TW)

(*) Notice: Subject to any disclaimer, the term of this patent is extended or adjusted under 35 U.S.C. 154(b) by 203 days.

(21) Appl. No.: 14/471,653

(22) Filed: Aug. 28, 2014

(65) Prior Publication Data
US 2016/0062250 A1    Mar. 3, 2016

(51) Int. Cl.
*G03F 7/20* (2006.01)

(52) U.S. Cl.
CPC .......... *G03F 7/70633* (2013.01); *G03F 7/705* (2013.01); *G03F 7/70258* (2013.01)

(58) Field of Classification Search
CPC .................................................. G03F 7/70633
See application file for complete search history.

(56) References Cited

U.S. PATENT DOCUMENTS

| | | | |
|---|---|---|---|
| 7,111,256 B2* | 9/2006 | Seligson | G03F 7/705 702/35 |
| 2002/0018217 A1* | 2/2002 | Weber-Grabau | G01N 21/956 356/601 |
| 2002/0111038 A1* | 8/2002 | Matsumoto | G03F 7/70458 438/763 |
| 2004/0101769 A1 | 5/2004 | Hassmann | |
| 2008/0041760 A1* | 2/2008 | Durben | G03F 1/66 206/710 |

(Continued)

FOREIGN PATENT DOCUMENTS

| CN | 1643452 | 7/2005 |
|---|---|---|
| CN | 103034067 | 4/2013 |

(Continued)

*Primary Examiner* — Michelle M Iacoletti
(74) *Attorney, Agent, or Firm* — Haynes and Boone, LLP

(57) ABSTRACT

The present disclosure provides a method. The method includes forming a resist layer on a patterned substrate; collecting first overlay data from the patterned substrate; determining an overlay compensation based on mapping of second overlay data from an integrated circuit (IC) pattern to the first overlay data from the patterned substrate; performing a compensation process to a lithography system according to the overlay compensation; and thereafter performing a lithography exposing process to the resist layer by the lithography system, thereby imaging the IC pattern to the resist layer.

20 Claims, 9 Drawing Sheets

(56) References Cited

U.S. PATENT DOCUMENTS

| | | | | |
|---|---|---|---|---|
| 2008/0057418 | A1* | 3/2008 | Seltmann | G03F 7/70633 430/30 |
| 2012/0154773 | A1 | 6/2012 | Beyer | |
| 2013/0230797 | A1* | 9/2013 | Van Der Sanden | G03F 7/70141 430/30 |
| 2015/0067617 | A1* | 3/2015 | Chang | G06F 17/5081 716/52 |

FOREIGN PATENT DOCUMENTS

| | | |
|---|---|---|
| CN | 103779188 | 5/2014 |
| JP | 2005513771 | 5/2005 |
| KR | 1020050097766 | 10/2005 |
| KR | 1020060055112 | 5/2006 |
| KR | 1020090067139 | 6/2009 |
| KR | 1020130132907 | 12/2013 |
| KR | 1020040021594 | 3/2014 |
| WO | WO-2012080008 | 6/2012 |

\* cited by examiner

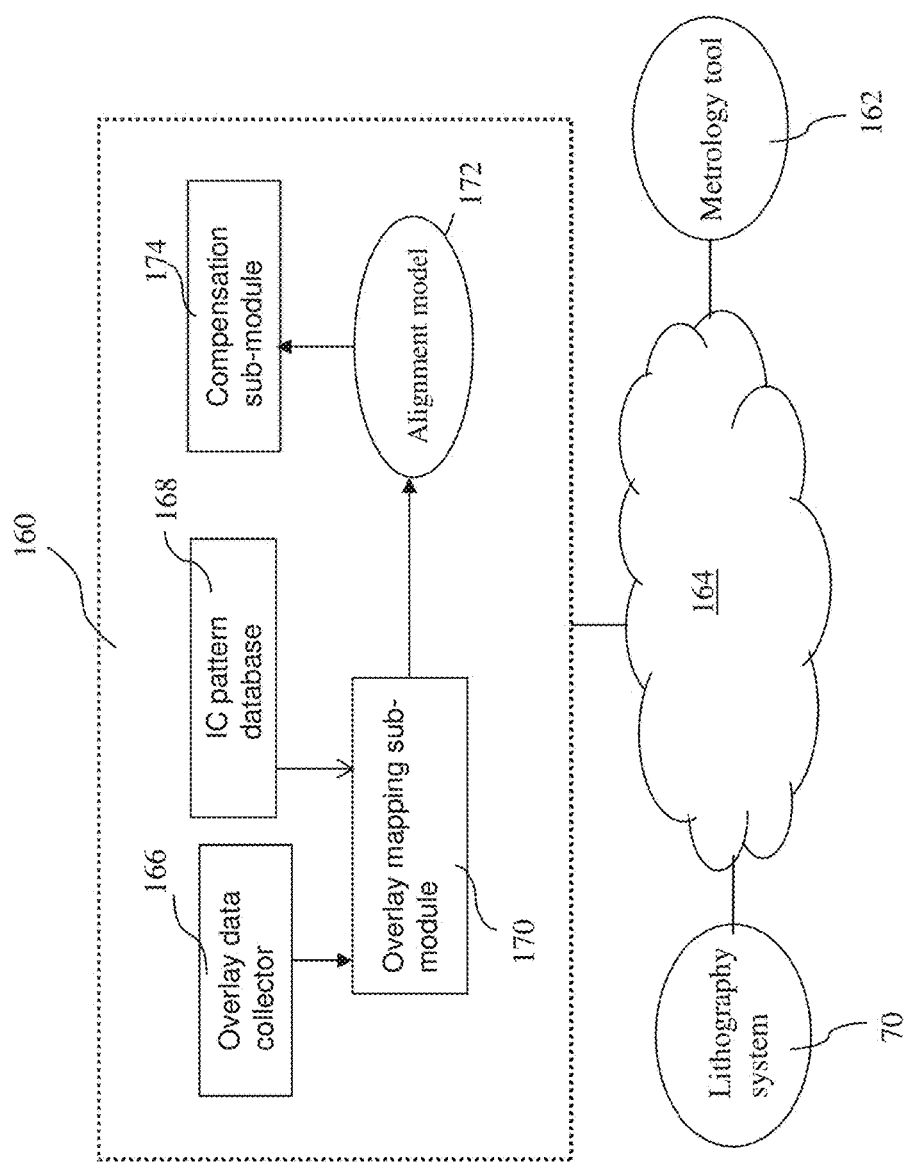

LITHOGRAPHY PROCESS AND SYSTEM WITH ENHANCED OVERLAY QUALITY

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized. Similar developments in IC processing and manufacturing are needed. For example, the overlay errors induced in lithography patterning are more challenging to reduce along with advanced lithography technologies. Therefore, what is needed is the structure for integrated circuit structure and the method making the same to address the above issue.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 9 is a block view of an overlay control module, constructed in accordance with some embodiments.

DETAILED DESCRIPTION

Figure 1:
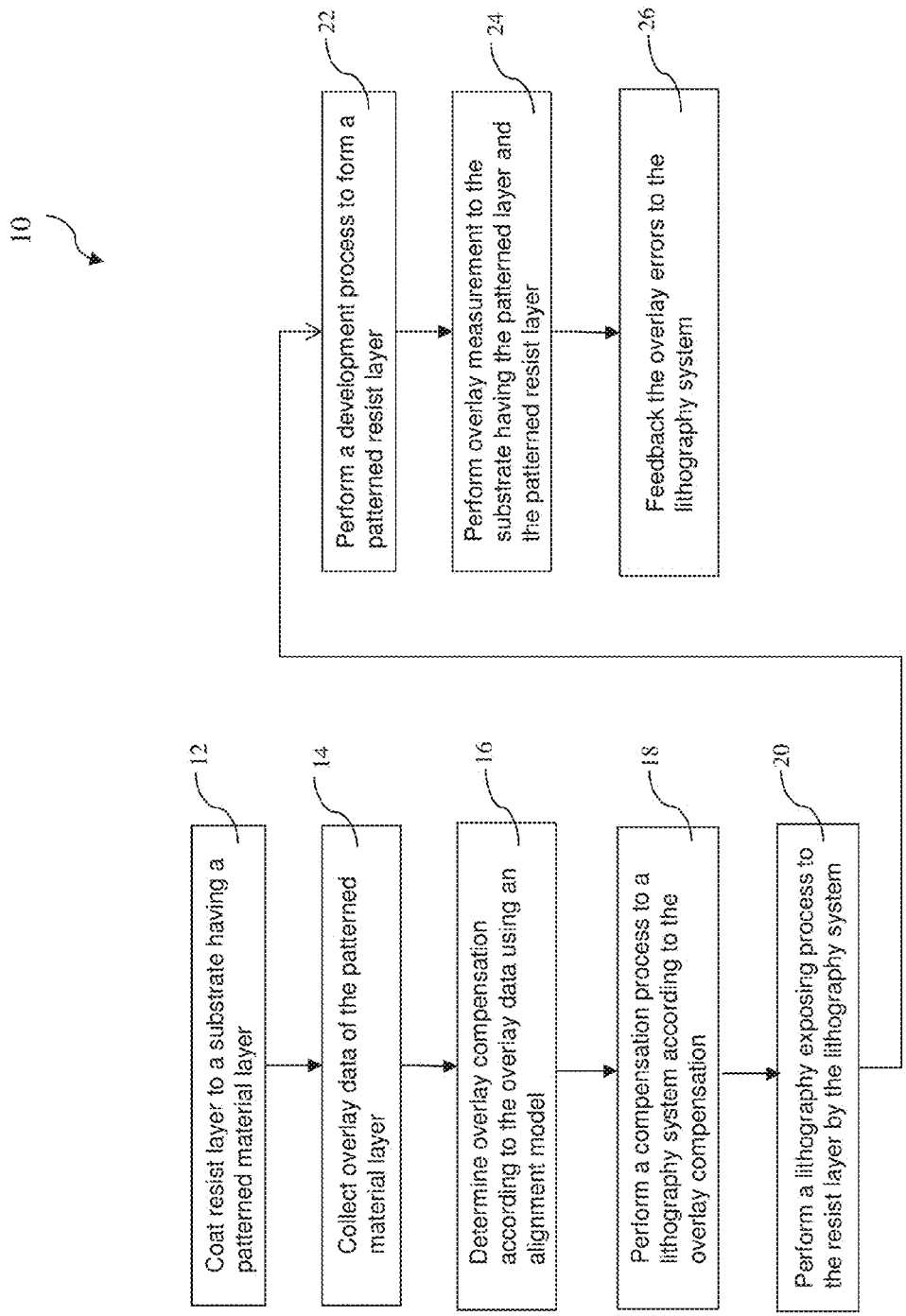
FIG. 1 is a flowchart of an integrated circuit fabrication method in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Figure 2:
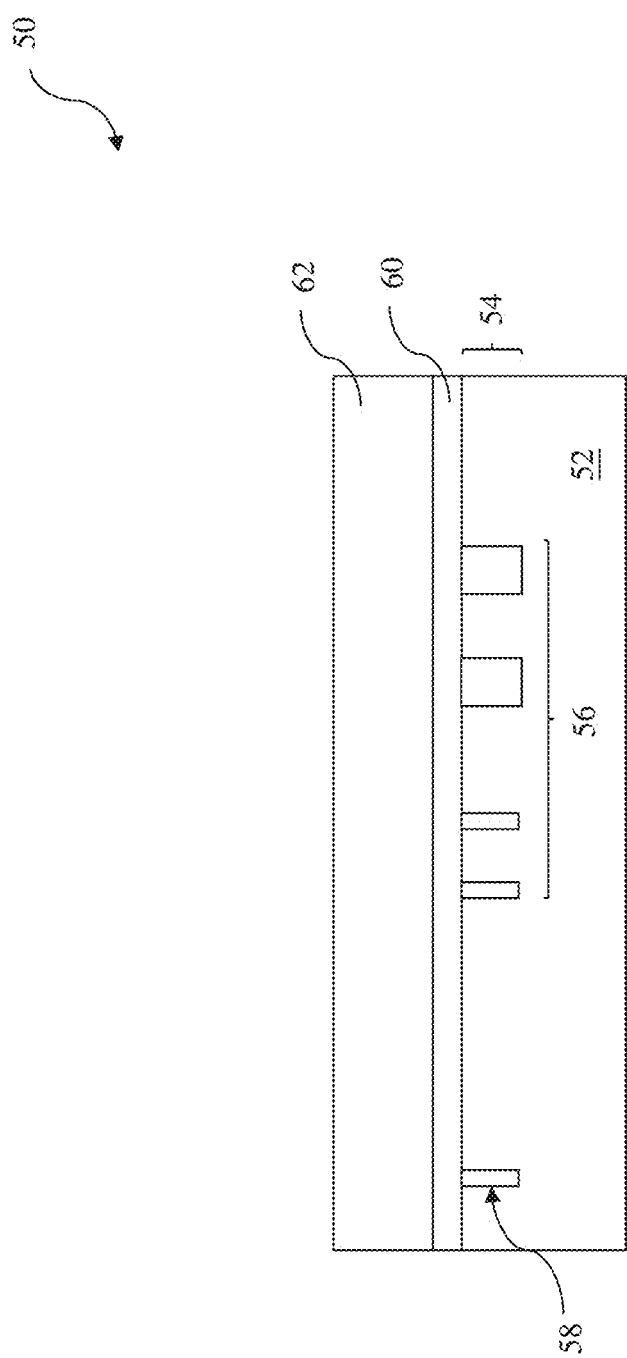
FIGS. 2 and 6 are sectional views of a substrate constructed in accordance with some embodiments.

FIG. 1 is a flowchart of a method 10 for fabricating an integrated circuit (IC) structure, constructed in accordance with some embodiments. FIG. 2 illustrates an exemplary IC structure 50 in a sectional view, constructed in accordance with some embodiments. The method 10 is described with reference to FIGS. 1-2 and other figures. The method 10 may begin at operation 12 by coating a resist layer on a substrate 52. In some embodiments, the substrate 52 is a semiconductor substrate, such as silicon substrate or a substrate having other semiconductor material (e.g., silicon germanium). Alternatively, the substrate 52 is a photomask (mask or reticle), or other suitable substrates, such as a thin-film-transistor liquid crystal display (TFT-LCD) substrate.

In the present embodiment, the substrate 52 includes a semiconductor wafer (such as a silicon wafer) having a patterned layer 54. The patterned layer 54 includes a first pattern formed in a first material layer. The first pattern includes a main pattern 56 having various main features. The main pattern 56 is defined according to an integrated circuit. The first pattern also includes various alignment marks 58 designed for alignment monitoring and overlay inspection. The first material layer of the patterned layer 54 may include a semiconductor material layer (such as silicon layer or silicon germanium layer), a dielectric material (such as an interlayer dielectric-ILD) or a conductive material (such as metal layer or a doped polysilicon layer) in various embodiments. The first material layer is patterned to form the first pattern by a suitable technology (such as lithography patterning). In various embodiments, the main pattern 56 includes a doping pattern (such as various source and drain features formed in a semiconductor material layer), a gate electrode pattern (having multiple gate electrodes of polysilicon or metal), or an interconnect pattern having a plurality of conductive features (such as contacts, vias, or metal lines).

The substrate 52 may include a second material layer 60 to be patterned in subsequent operations to form a second pattern in a way that the second pattern is aligned to the first pattern. Thereby, the corresponding overlay errors between the first and second patterns are effectively reduced, such as being within a tolerable range defined in the product specification.

In some embodiments, the second material layer 60 is disposed on the patterned layer 54 and includes a semiconductor material layer (such as silicon layer or silicon germanium layer), a dielectric material (such as silicon oxide, silicon nitride or low k dielectric material layer) or a conductive material (such as a doped polysilicon layer, a copper layer, or an aluminum layer). In one embodiment, the first pattern of the patterned layer 54 includes source and drain features and the second pattern to be formed in the second material layer 60 includes contacts designed to land on the source and drain features. In another embodiment, the first includes a plurality of metal lines and the second pattern includes via features designed to land on the metal lines. In alternative embodiments, the second pattern is also to be formed in the patterned layer 54, such as in double patterning. In those cases, the second material layer 60 may be eliminated. In one example for illustrating a double patterning process, the first pattern is formed in a hard mask layer, and the second pattern is subsequently formed in the same hard mask layer. The combined pattern, including the first and second patterns, is then transferred from the hard mask to an underlying material layer with a reduced pattern pitch.

Figure 3:
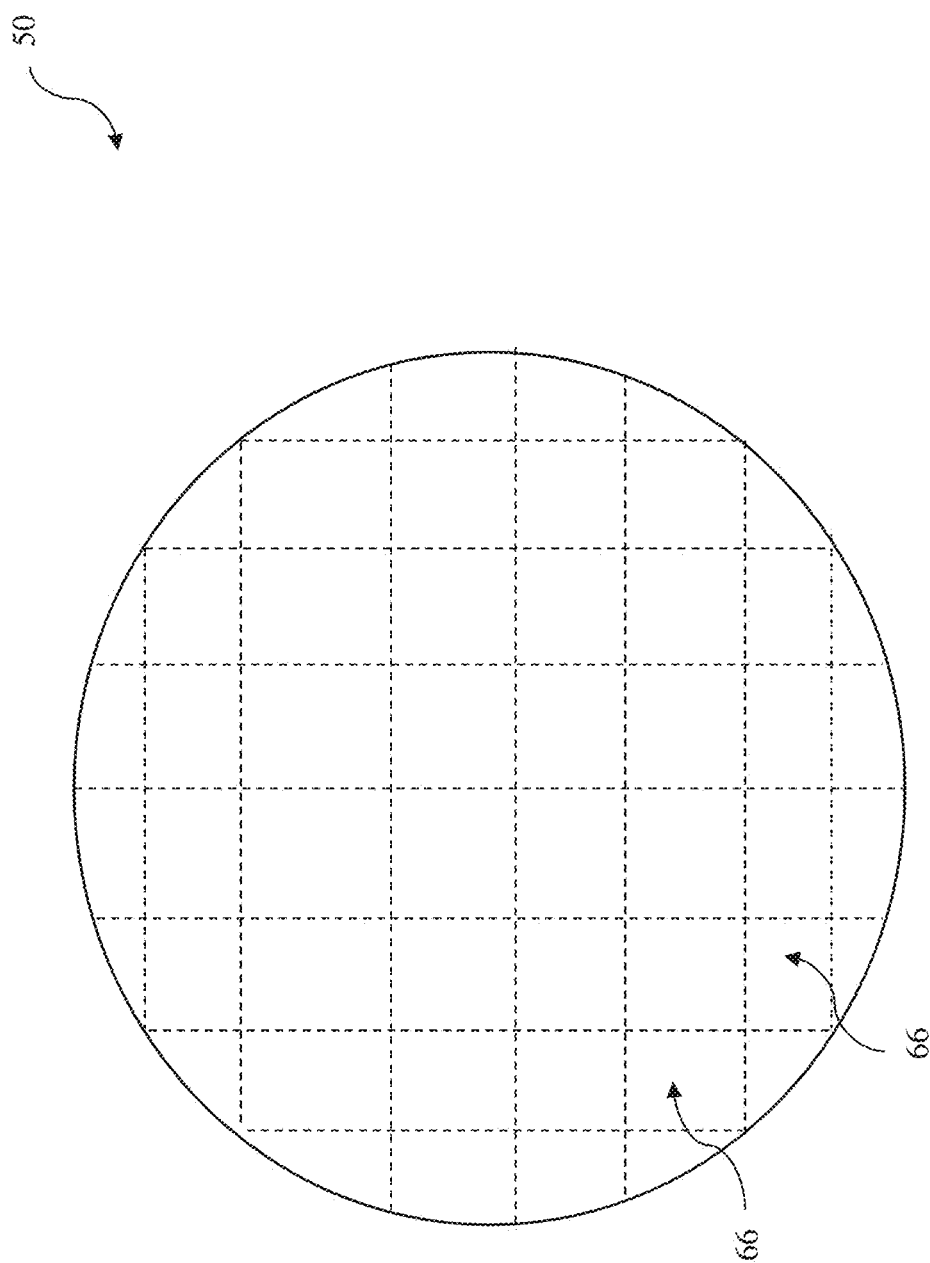
FIG. 3 is a top view of the substrate of FIG. 2, constructed in accordance with some embodiments.

The substrate 52 is further described with a reference to FIG. 3 in a top view. In the following description, the substrate 52 is a wafer. A wafer goes through a plurality of IC fabricating operations, thereby forming multiple chips (dies) on the wafer. Each chip includes a functional integrated circuit. The substrate 52 further includes scribe lines defined between the chips. The chips are separated by dicing through the scribe lines at a later fabrication stage.

On the other aspect, the wafer 50 is divided into multiple fields 66. During the lithography patterning process to form the second pattern on the resist layer 62, the second pattern is defined on a photomask (also referred to as mask or reticle) and is repeatedly transferred to each field of the wafer 50. Particularly, the lithography patterning process includes an exposing process in a proper mode, such as step and scan. The mask is relatively stepped to a field of the wafer and the corresponding mask pattern is transferred to that field, and then the mask is stepped to a next field and the mask pattern is transferred to the field, and so on until the fields of the wafer are exhausted. In some embodiments, each field 66 includes one chip or alternatively multiple chips. In some embodiments, the alignment marks are formed on each field. For example, the alignment masks are formed on chip areas and the scribe lines. The number of the alignment marks and the positions of the alignment marks are designed to have sufficient coverage of the wafer from field to field and/or from chip to chip. In furtherance of the example, a first number of alignment marks are defined and formed on a chip and a second number of alignment marks are defined and formed on the scribe lines and/or regions between the fields. The patterned layer 54 is formed similarly and includes a set of alignment marks paired with the alignment marks in the second pattern to be formed on the resist layer 62.

In the operation 12, a resist layer 62 is coated on the substrate 52 by a proper technique, such as spin-on coating. The resist layer 62 is sensitive to the radiation beam during a lithography exposing process and is resistive to a subsequent process (such as etching or ion implantation). In some embodiments, the resist layer 62 includes a polymeric material as a matrix that is resistive; radiation-sensitive component (such as photo-acid generator or PAG); and solvent. The resist layer 62 may be positive-tone resist or negative tone resist. The operation 12 may further include other processing steps, such as a thermal baking step to reduce the solvent of the resist layer after the spin-on coating.

The method 10 includes an operation 14 by collecting overlay data of the patterned layer 54. In some embodiments, the overlay data includes the locations of the alignment marks or a map of the alignment marks in the patterned layer 54. The alignment data is different from the overlay data. The alignment data is designed for the purpose of alignment verification and the data volume is insufficient for overlay purpose. The overlay data collected from the alignment marks has a much great volume and is associated with a greater number of the alignment marks. In the present embodiment, the overlay data includes mapping locations of the all alignment marks on the corresponding wafer. This is referred to as full mapping of the alignment marks. The full mapping is implemented to provide sufficient overlay data from location to location, especially when the feature sizes are decreased and the wafer sizes are increased along with the advances of the technology nodes. However, the operation 104 costs more overlay measurement time.

In some embodiments, the collecting of the overlay data of the patterned layer 54 is implemented in one or more standalone overlay metrology tool (an offline mode). The number of the overlay metrology tools to be used for this operation is determined based on the throughput of the operation 14 and the throughput of an exposing process to the resist layer 62 in order to eliminate the waiting time of the corresponding lithography system. In some embodiments, such association between the exposing process by the lithography system and overlay measurement by the overlay metrology tool(s) is dynamic, depending on the individual recipes of the exposing process to individual products.

Figure 4:
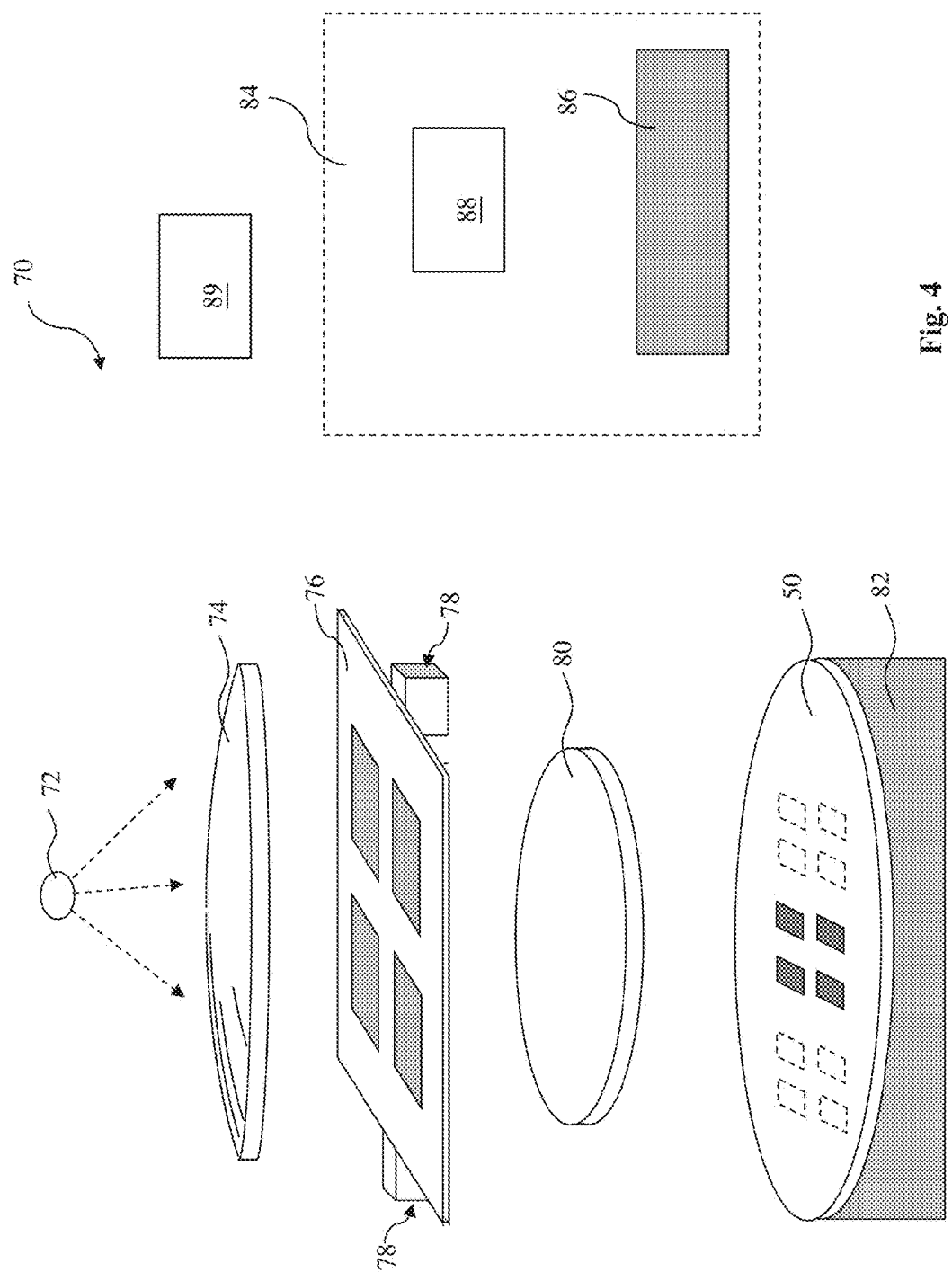
FIG. 4 is a schematic view of a lithography system in accordance with some embodiments.

In some embodiments, the collecting of the overlay data of the patterned layer 54 is implemented in an inline mode, specifically inside a lithography system 70 that is used to perform the exposing process to the resist layer 62. This lithography system 70 is illustrated in FIG. 4 as a diagrammatical view in accordance with some embodiments.

The lithography system 70 includes a radiation source (or source) 72 to provide radiation energy. The radiation source 72 may be any suitable light source. In various embodiments, the radiation source may include a light source selected from the group consisting of ultraviolet (UV) source, deep UV (DUV) source, and EUV source. For example, the source 72 may be a mercury lamp having a wavelength of 436 nm (G-line) or 365 nm (I-line); a Krypton Fluoride (KrF) excimer laser with wavelength of 248 nm; an Argon Fluoride (ArF) excimer laser with a wavelength of 193 nm; a Fluoride ($F_2$) excimer laser with a wavelength of 157 nm; or other light sources having a desired wavelength (e.g., below approximately 100 nm). In another example, the light source has a wavelength of about 13.5 nm or less.

The lithography system 70 also includes an optical subsystem that receives the radiation energy from the radiation source 72, modulates the radiation energy by a mask 76 and directs the radiation energy to a resist layer 62 coated on a substrate 52. In some embodiments, the optical subsystem is designed to have a refractive mechanism. In this situation, the optical subsystem includes various refractive components, such as lenses.

In some particular embodiments, the lithography system 70 includes an illumination module (e.g., a condenser) 74. The illumination module 74 may include a single lens or a lens module having multiple lenses and/or other lens components. For example, the illumination module 54 may include microlens arrays, shadow masks, and/or other structures designed to aid in directing radiation energy from the radiation source 72 onto the mask 76 that defines the second pattern to be transferred to the resist layer 62.

The mask 76 is loaded and secured on a mask stage 78 of the lithography system 70. The mask stage 78 is designed and configured to be operable for translational and rotational motions.

The lithography system 70 includes a projection module 80. The projection module 80 may have a single lens element or a plurality of lens elements configured to provide proper illumination to the resist layer on a wafer. Each lens element may include a transparent substrate and may further include a plurality of coating layers. The illumination module 74 and the projection module 80 are collectively referred to as the optical subsystem. The optical subsystem may further include additional components such as an entrance pupil and an exit pupil to form an image of the mask 76 on the substrate 52 secured on a substrate stage 82, which is capable of securing and moving a substrate 52 in translational and rotational modes.

In other embodiments where the radiation energy is EUV energy, the mask 76 and the optical subsystem are designed to have a reflective mechanism. In this situation, the optical subsystem includes various reflective components, such as mirrors, designed and configured to achieve the respective functions. The mask 76 has a reflective structure. In one example for illustration, the mask 76 includes a substrate with a low thermal expansion material (such as $TiO_2$ doped $SiO_2$); a multiple reflective multiple layers (ML) deposited on the substrate where the ML includes a plurality of film pairs (such as molybdenum-silicon film pairs); and an absorption layer (such as a tantalum boron nitride layer) deposited over the ML. The absorption layer is patterned according to an IC design layout.

Particularly, the lithography system 70 includes a built-in overlay module 84 coupled with the wafer stage 82 for wafer exchanges and designed with a function for alignment and overlay monitoring. The one or more overlay module 84 includes one or more overlay wafer stages 86 to receive wafers for collecting the overlay data from the wafers. Each of the overlay wafer stages 86 also includes or is integrated with a mechanism 88 that is operable to collect the overlay data from the wafer secured on the corresponding overlay wafer stage. For example, the mechanism 88 includes an imaging module that is capable of mapping the alignment marks of the wafer.

The number of the wafer stages 86 integrated in the lithography system 70 is associated with the throughput of the operation 14 and the throughput of the exposing process such that the efficiency of the exposing process by the lithography system 70 will not be impacted by the operation 14, considering much long processing time for overlay data collecting with the full mapping of the overlay data. In one example for further explanation, a plurality of wafers (such as 25 wafers in a lot) are loaded to the lithography system 70, are processed for collecting overlay data when each wafer is secured on one of the wafer stages 86 and are subsequently applied by the exposing process when each is secured on the wafer stage 82. The capacity of the wafer stages 86 for the operation 14 is no less than the capacity of the lithography system 70 for the exposing process wafer by integrating a proper number of the wafer stages 86. Therefore the lithography system 70 maintains its efficiency to implement the exposing process and is able to collect the overlay data in full mapping by the overlay module 84.

In some embodiment, the lithography system 70 further includes an overlay control module 89 integrated with components. The overlay control module 89 is able to generate overlay compensation and controls to adjust the projection module according to the overlay compensation, thereby reducing the overlay errors and enhancing the overlay quality. The overlay control module is further described in FIG. 9 in accordance with some embodiments.

Back to the method 10 of FIG. 1. In some embodiments, the operation 14 is implemented in a combined mode that utilizing both offline and inline collecting of the overlay data. In furtherance of the embodiments, when a batch of wafers (such as 25 wafers in a lot) are processed to collect the overlay data at the operation 14, first subset of the wafers in the batch go to the overlay metrology tool(s) for collecting overlay data in the offline mode and second subset of the wafers in the batch go to the overlay module 84 of the lithography system 70 for collecting overlay data in the inline mode.

Still referring to FIG. 1, the method 10 includes an operation 16 by determining overlay compensation according to the overlay data collected from the patterned layer 54 using an alignment model. In some embodiments, the overlay compensation includes one or more parameters to be used in a subsequent operation, in order to eliminate or reduce the overlay errors. The operation 16 includes various actions (sub-operations), leading to the determination of the overlay compensation. Those sub-operations are further described below.

The overlay errors are evaluated from the displacement differences between the first alignments marks 58 of the patterned layer 54 and the corresponding second alignment marks to be formed on the resist layer 62. Since the first overlay data collected at the operation 14 includes the mapping data from the first alignment marks 58 in the patterned layer 54 and the resist layer 62 is not patterned yet at this stage, the second overlay data of the resist layer 62 is determined differently. In some embodiments, the second pattern to be formed on the resist layer 62 is defined on the mask 76 and will be transferred to the resist layer 62 at the later exposing process. The pattern of the mask 76 includes main circuit pattern and further includes the second alignment marks. Therefore, the second overlay data that includes the mapping data of the second alignment marks on resist layer 62 is collected from the mask 76, such as by imaging of the mask and extracting the mapping data of the second alignment marks, in some embodiments. In alternative embodiments, the second overlay data that includes the mapping data of the second alignment marks on resist layer 62 is directly extracted from the database having the pattern of the mask 76.

Figure 5:
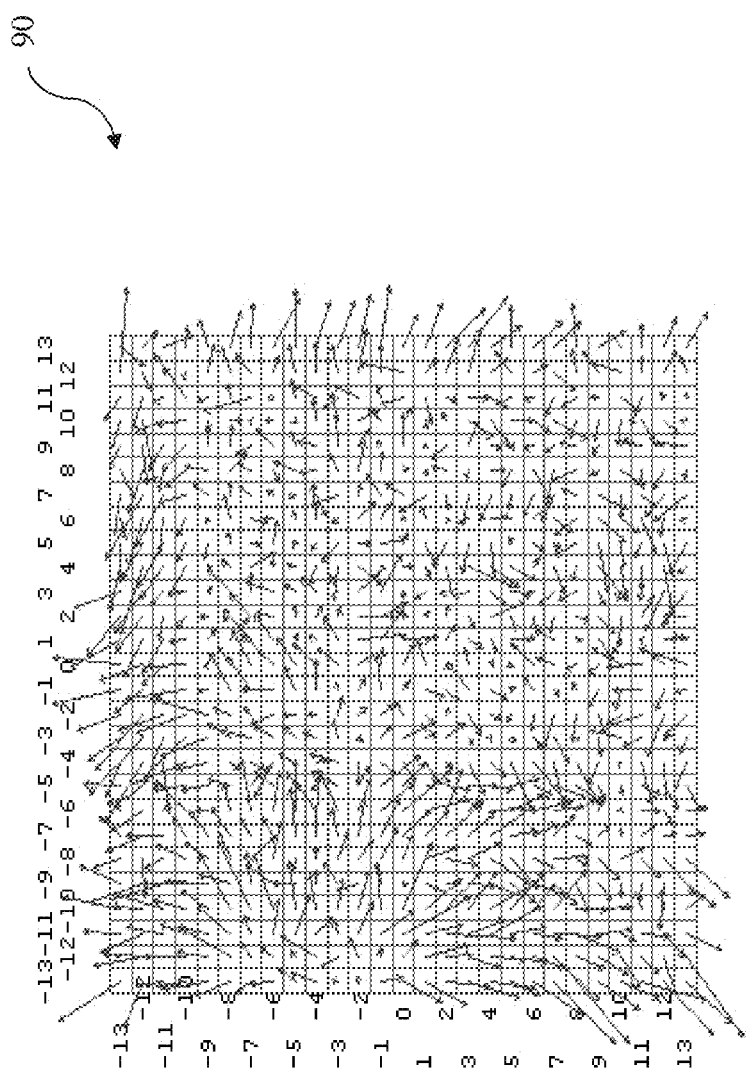
FIG. 5 is a diagrammatic view of an overlay map in accordance with some embodiments.

The overlay errors are determined according to the displacement differences between the first alignment marks 58 collected from the patterned layer 54 by the operation 14 and the second alignment marks, respectively. More particularly, one of the first overlay marks and the corresponding one of the second overlay marks are mapped for the location difference, leading to one overlay error to that pair of the overlay marks. In some examples, each overlay error is a vector including a magnitude and a direction. The overlay errors are thus determined by a plurality of overlay errors corresponding to multiple pairs of the first and second alignment marks. The overlay errors provide a map of multiple overlay errors, forming a vector map. A portion of the overlay map 90 is illustrated in FIG. 5 in accordance with one example. In some embodiments, the overlay map is a full map determined from the first overlay data having location map of all of the first alignment marks in the patterned layer 54 and the second overlay data having location map of all of the second alignment marks to be formed on the resist layer 62.

An alignment model is utilized to determine overlay compensation that is associated to one or more system parameters (also referred to as compensation parameters) of the lithography system 70. The overlay compensation is operable to be applied to the lithography system 70 such that the lithography system 70 is adjusted accordingly, particularly the system parameter(s) being adjusted. In some embodiments, the overlay compensation is associated to the optical subsystem (such as the projection module 80) and is applied to adjust the optical subsystem in order to eliminate or reduce the overlay errors during the subsequent exposing process. For example, the overlay compensation is applied to the projection module 80 such that the various optical components (such as lens or mirrors) are tuned with a configuration such that the imaging of the mask pattern to the wafer has decreased overlay errors. In one particular example, the compensation parameters are one or more optical parameters, such as one or more coefficients of the Zernike polynomial associated with the projection module 80.

The alignment model is constructed to associate the overlay errors to the compensation parameter(s). For example, the alignment model takes the overlay errors as the input and provides the correction (overlay compensation) as the output. The correction includes various corrections to the lithography system 70, in order to reduce both systematic and random overlay errors. In some embodiments, the alignment model is used to provide correction per exposure and the correction includes intra-field high order process correction (iHOPC).

The iHOPC is further described below according to some embodiments. In general, the wafer is translated, scaled and rotated due to the wafer processing and the stage errors of a lithography system, such as the lithography tool 70 to be described in FIG. 4. Therefore, a measured wafer exposure position (such as a representative position Xi, Yi) deviating from its ideal grid can be represented in a 6-parameter linear model that represents the corresponding deviations dXi and dYi along X and Y directions, respectively, in two equations:

$$dXi = Tx + X\mathrm{mag}*Xi - Xrot*Yi + ResXi \quad (1)$$

$$dYi = Ty + Y\mathrm{mag}*Yi - Yrot*Xi + ResYi \quad (2)$$

where Tx, Ty, Xmag, Ymag, Xrot, Yrot are translations, magnifications, rotations and grid residuals for both X and Y directions, respectively. However, the wafer information cannot be modeled well with the 6-parameter linear model and substantial residuals are left for the fabrication of, such as for DRAM circuit. To improve overlay, an additional correction is performed by applying a higher order model to reduce the residuals.

The correction per exposure (CPE) determines a 6-paramter correction for every exposed field giving the best interfiled correction possible. Next to that it is possible to model the data using high order process correction (HOPC) allowing a higher order interfiled process correction, which includes second order, third order or even higher orders terms. Those higher order terms are non-linear.

The alignment model is built up through a proper procedure. In some embodiments, the procedure includes selecting the compensation parameter(s), constructing a mathematical formula having the compensation parameter(s) as a function of the overlay errors (or some extracted variables of the overlay errors), and determining the coefficients of the formula according to manufacturing data. In some embodiments, the manufacturing data includes historic data of the overlay errors and the corresponding compensation parameters of the lithography system 70.

In the operation 16, the overlay compensation is determined according to the overlay errors using the alignment model. In some embodiment, the overlay compensation may additionally or alternatively include other system parameters, such as clamping force, tilting angle, translational shift, and/or rotational shift of the wafer stage 80. In some embodiments, the corrections may additionally include various corrections to the lithography exposing process.

Referring back to FIG. 1, the method 10 includes an operation 18 by performing a compensation process to the lithography system 70 according to the overlay compensation determined at the operation 16. During the operation 18, the lithography system 70 is adjusted according to the overlay compensation. In some embodiments, the projection module 80 is adjusted. In some other embodiments, the wafer stage 82 is additionally or alternatively adjusted. In some other embodiments, other module of the lithography system is included in the alignment model and the compensation process. For example, mask stage 78 may be included in the alignment model and the compensation process. In a more particular example, the clamping force or tilting angle of the mask stage 78 is a compensation parameter. By the operation 18, the lithography system 70 is corrected to reduce the overlay errors in a feed forward manner since the overlay compensation is determined based on the overlay data from wafer and the subsequent exposing process is applied to the same wafer by the corrected lithography system.

Still referring to FIG. 1, the method 10 includes an operation 20 by performing a lithography exposing process to the resist layer 62 coated on the wafer 50 in the lithography system 70. During the lithography exposing process, the radiation beam from the radiation source 72 is directed to the mask 76 and further directed to the resist layer 62, thereby forming a latent pattern on the resist layer 62. The latent pattern includes the mask pattern that is repeatedly displaced in various fields of the wafer 50.

In some embodiment, the operation 20 also further includes performing an alignment process and performing a focus process prior to the lithography exposing process. The alignment process properly aligns the mask 76 with the wafer 50 when both are secured on the mask stage 78 and the wafer stage 82, respectively. The focus process includes tuning the depth of focus of the optical subsystem.

Since the lithography system 70 is adjusted according to the overlay compensation at the operation 18, the latent pattern formed on the resist layer 62 has substantially reduced overlay errors. Especially in the present embodiment, the overlay compensation is implemented according to the determined overlay errors of the wafer 50 that the lithography exposing process is applied, therefore the compensation process is more accurate and effective.

Figure 6:
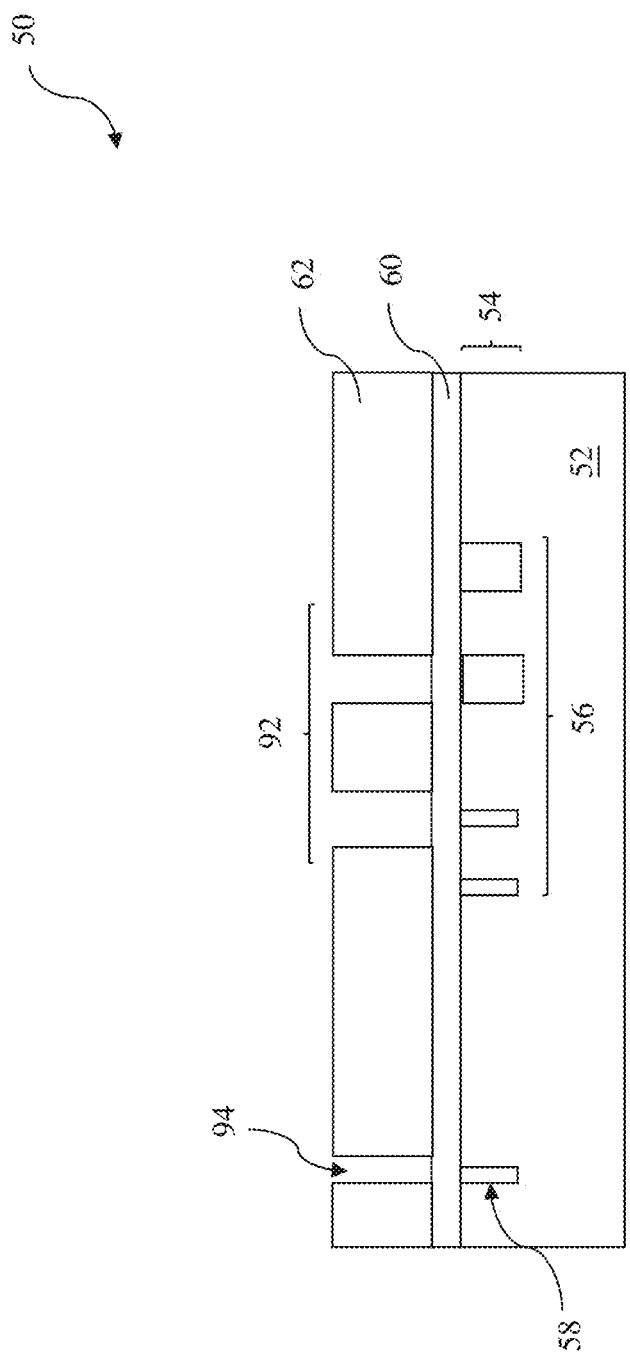

Still referring to FIG. 1, the method 10 may include an operation 22 by performing a developing process to the resist layer 62 to form a patterned resist layer. For example where the resist layer is positive tone resist, the exposed portion of the resist layer will be removed by the developing process. In another example where the resist layer is negative tone resist, the unexposed portion of the resist layer will be removed by the developing process but the exposed portion remains. Therefore, by the developing process at operation 22, the latent pattern of the exposed resist layer is converted to a patterned resist layer with various openings, within the openings the underlying material layer 60 is uncovered, as illustrated in FIG. 6 in a sectional view. The patterned resist layer 62 includes the main circuit pattern 92 and the second alignment marks 94. In some embodiments, the operation 22 may further include other steps, such as post exposure baking (PEB) prior to the developing process and/or hard baking after the exposing process.

The method 10 may include an operation 24 by performing an overlay measurement to the wafer 50 for the overlay errors between the patterned resist layer 62 and the patterned layer 54. The overlay measurement, at this stage, is able to directly measure the displacement errors between the first alignment marks 58 and the second alignment marks 94 in pairs. The overlay measurement in the operation 24 is implemented in a suitable overlay metrology tool that is operable to simultaneously image both first and second alignment marks.

The method 10 may further include other operations. The method 10 may further include an operation 26 by feeding back the overlay errors measured at operation 24 to the lithography system 70. In some embodiments, the measured overlay errors may be fed back for additional tuning/adjustment of the lithography system 70. For example, the operation 26 includes determining overlay compensation from the measured overlay errors using the alignment model, and performing an overly compensation process to the lithography system 70 to adjust one or more compensation parameters. In some embodiments, the measured overlay errors may be fed back to the alignment model so that the alignment model is tuned accordingly. For example, the operation 26 includes adjusting various coefficients in the mathematical formula of the alignment model according to the measured overlay errors.

The method 10 may further include an operation to transfer the second pattern from the patterned resist layer 62 to the underlying material layer 60. In some embodiment, an etching process is applied to etch the underlying material layer 60 using the patterned resist layer 62 as an etch mask. In some embodiment, an ion implantation process is applied to introduce doping species to the underlying material layer 60 using the patterned resist layer 62 as an implantation mask.

Figure 7:
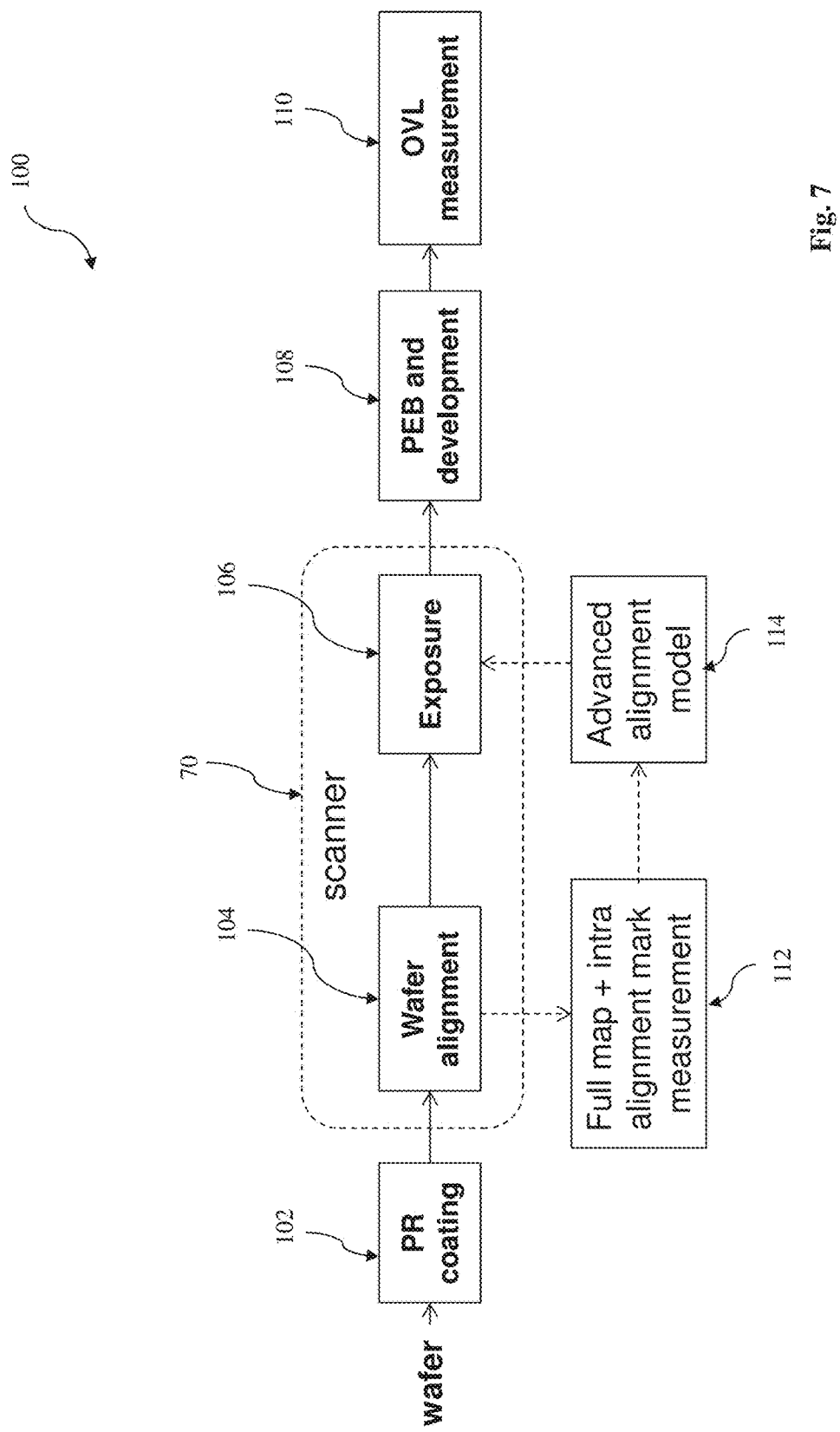
FIG. 7 is a flowchart of an integrated circuit fabrication method in accordance with some embodiments.

Other alternatives or embodiments may present without departure from the spirit and scope of the present disclosure. FIG. 7 illustrates a block view of a method 100 in accordance with some embodiments. The method 100 includes an operation 102 for coating a wafer with resist layer ("PR"); an operation 104 for wafer alignment in the lithography system ("scanner") 70 and an operation 106 for applying a lithography exposing process to the wafer in the lithography system 70. The method 100 also includes an operation 108 for post-exposure baking (PEB) and development to form a patterned resist layer. The method 100 further includes an operation 110 for an overlay ("OVL") measurement to determine the overlay errors between the patterned resist layer and the underlying patterned layer on the wafer. When the overlay errors measured at the operation 110 are within a tolerable range, such as the range defined in the production specification, the method 100 may proceed to subsequent operation, such as etching or ion implanting to the underlying material layer through the openings of the patterned resist layer. Furthermore, the method 100 includes an operation 112 for alignment mark measurement with full map of all intra-filed and inter-field alignment marks. The operation 112 provides an evaluation of the overlay errors. In some embodiments, the operation 112 is similar to the operation 14 of the method 10. Particularly, the lithography system 70 is designed to have two or more alignment wafer stages. The full map alignment mark measurement at operation 112 is implemented in an inline mode, in which all the overlay data is collected from the alignment wafer stages in the lithography system 70. The method 100 further includes an operation 114 for tuning the lithography system using the advanced alignment model before the operation 106. In some embodiments, the operation 114 is similar to the operations 16 and 18. Thus, the method 100 provides a lithography process that includes overlay correction to effectively reduce the overlay errors.

Figure 8:
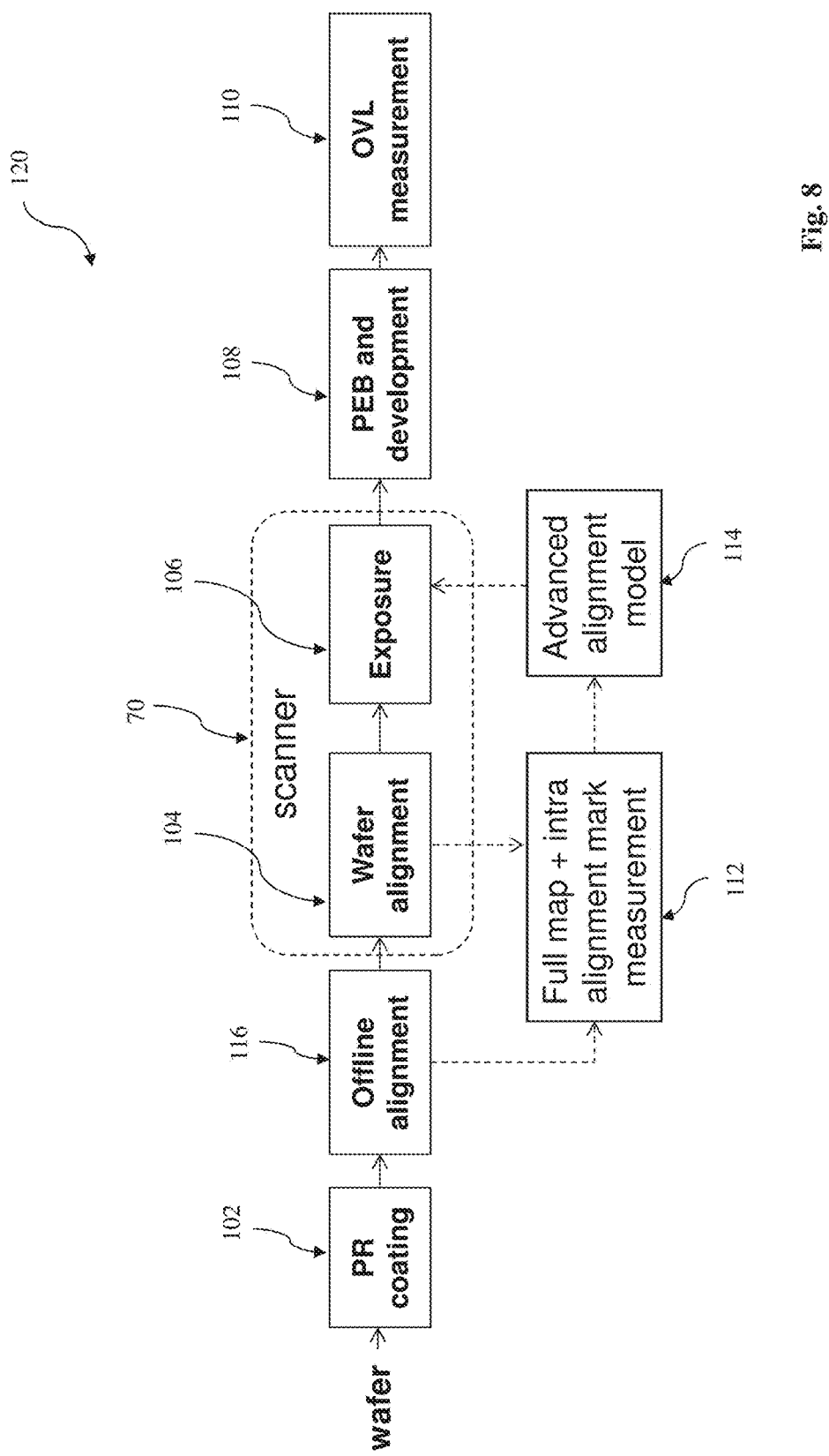
FIG. 8 is a flowchart of an integrated circuit fabrication method in accordance with some embodiments.

FIG. 8 illustrates a block view of a method 120 in accordance with some embodiments. The method 120 includes an operation 102 for coating a wafer with photoresist layer ("PR"); and an operation 116 for collecting overlay data in an offline mode. The operation 116 is implemented in one or more overlay metrology tools, minimizing the impact to the throughput of the lithography system 70. The method 120 also includes an operation 104 for wafer alignment in the lithography system (or scanner) 70 and an operation 106 for applying a lithography exposing process to the wafer in the lithography system 70. The method 100 also includes an operation 108 for post-exposure baking ("PEB") and development to form a patterned resist layer. The method 100 further includes an operation 110 for an overlay ("OVL") measurement to determine the overlay errors between the patterned resist layer and the underlying pattern formed on the wafer. When the overlay errors measured at the operation 110 are within a tolerable range, such as the range defined in the production specification, the method 100 may proceed to subsequent operation, such as etching or ion implanting to the underlying material layer through the openings of the patterned resist layer. Furthermore, the method 100 includes an operation 112 for alignment mark measurement with full map of all intra-field alignment marks and inter-field alignment marks. The operation 112 provides an evaluation of the overlay errors. In some embodiments, the operation 112 is similar to the operation 14 of the method 10. Particularly, the full map alignment mark measurement at operation 112 collects the overlay data from the standalone overlay metrology tools in offline mode and from the alignment wafer stage is inline mode as well. The method 100 further includes an operation 114 for tuning the lithography system using the advanced alignment model before the operation 106. In some embodiments, the operation 114 is similar to the operations 16 and 18. Thus, the method 100 provides a lithography process that includes overlay correction to effectively reduce the overlay errors.

FIG. 9 is a block diagram of an overlay control module 160 used to implement the method 10, method 100 or method 120, constructed in accordance with some embodiments. The overlay control module 160 is described with reference to FIG. 9 and other figures. In some embodiments, the overlay control module 160 is embedded in the lithography system 70, as illustrated by block 89 in FIG. 4. In some embodiments, the overlay control module 160 is alternatively distributed in a manufacturing execution system and is coupled with the lithography system 70 and one (or more) overlay metrology tool 162 through a data communication network 164, such as intranet or Internet.

The overlay control system 160 includes an overlay data collector 166 designed to collect overlay data from the patterned layer 54 of the wafer 50. In some embodiments, the overlay data collector 166 receives the overlay data from one or more standalone overlay metrology tools in offline mode or alternatively from the built-in overlay module 84 of the lithography system 70 in inline mode. The overlay data collector 166 includes software or storing media in organizing and storing the overlay data.

The overlay control module 160 includes an IC pattern database 168 designed to store second pattern, which includes the mask pattern defined on the mask 76 and to be formed on the resist layer 62. Alternatively, the second pattern is directly collected from the mask 76. In some embodiments, the IC pattern database 168 further functions to extract the second overlay data from the second pattern.

The overlay control module 160 may include an overlay mapping sub-module 170 designed to determine the full mapping of the overlay errors based on the first overlay data from data collector 166 and the second overlay data from the IC pattern database 168. In some embodiments, the overlay mapping sub-module 166 provides an output of a full map of the overlay errors, such as one illustrated in FIG. 5, in portion. The overlay mapping sub-module 166 may further include a function to extract the second overlay data from the second pattern.

The overlay control module 160 also includes an alignment model 172. The alignment model 172 functions to determine overlay compensation that is associated to one or more system parameters (compensation parameters) of the lithography system 70. The overlay compensation is applied to the lithography system 70, thereby adjusting the system parameter(s) thereof accordingly. The overlay model 172 has an input from the overlay mapping sub-module 166, and generates overlay compensation as an output to a compensation sub-module 174.

The compensation sub-module 174 is designed to control the adjustment of the compensation parameters, such as lens parameters in the projection module 80. In some embodiments, the overlay compensation is associated to the optical subsystem (such as the projection module 80) and is applied to adjust the optical subsystem in order to eliminate or reduce the overlay errors during the subsequent exposing process. For example, the overlay compensation is applied to the projection module 80 such that the various optical components (such as lens or mirrors) are tuned with a configuration such that the imaging of the mask pattern to the wafer has decreased overlay errors.

The present disclosure provides a method for a lithography process with overlay correction per exposure, where the overlay compensation is determined according to the predetermined overlay errors and is applied to compensate the lithography system to enhance the overlay quality. The overlay compensation is generated using the alignment model, and includes one or more system parameter, such as optical parameter of the projection module. The method collects the overlay data in offline mode, in inline mode or a combination thereof. The method provides full mapping of the overlay data and provides intra-field high order process correction.

The embodiments of the present disclosure offer advantages over existing art, though it is understood that other embodiments may offer different advantages, not all advantages are necessarily discussed herein, and that no particular advantage is required for all embodiments. By utilizing the disclosed method, the full mapping and intra-field high order process correction are achieved without decreasing the throughput of the lithography exposing process. The method also provides dynamic feed forward control to reduce overlay errors, enhancing the overlay quality wafer by wafer and lot by lot.

Thus, the present disclosure provides a method in accordance with some embodiments. The method includes forming a resist layer on a patterned substrate; collecting first overlay data from the patterned substrate; determining an overlay compensation based on mapping of second overlay data from an integrated circuit (IC) pattern to the first overlay data from the patterned substrate; performing a compensation process to a lithography system according to the overlay compensation; and thereafter performing a lithography exposing process to the resist layer by the lithography system, thereby imaging the IC pattern to the resist layer.

The present disclosure also provides a method in accordance with some other embodiments. The method includes forming a patterned material layer on a substrate on a substrate; coating a resist layer on the patterned material layer substrate; collecting first overlay data from the patterned material layer; determining an overlay compensation based on displacement differences between second overlay data from an integrated circuit (IC) pattern and the first overlay data from the patterned material layer using an alignment model; performing a compensation process to an optical sub-module of a lithography system according to the overlay compensation; and thereafter performing a lithography exposing process to the resist layer by the lithography system, thereby forming a latent pattern in the resist layer wherein the latent pattern includes the IC pattern.

The present disclosure provides a lithography system in accordance with some embodiments. The lithography system includes a radiation source designed to generate a radiation beam for a lithography exposing process; an optical module to image an integrated circuit (IC) pattern to a semiconductor wafer during the lithography exposing process; a wafer stage configured to secure the semiconductor wafer for the lithography exposing process; and an overlay control module designed to generate an overlay compensation and feed forward the overlay compensation to adjust an optical parameter of the optical module.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a resist layer on a patterned substrate;
    collecting, in an inline mode, first overlay data from the patterned substrate;
    collecting, in an offline mode, second overlay data from the patterned substrate;
    receiving, from an integrated circuit (IC) pattern database, an IC pattern of a mask;
    extracting, directly from the IC pattern database, third overlay data of the IC pattern of the mask;
    determining an overlay compensation based on mapping of the third overlay data from the IC pattern of the mask to the first overlay data from the patterned substrate;
    performing a compensation process to a lithography system according to the overlay compensation; and
    performing a lithography exposing process to the resist layer by the lithography system, thereby imaging the IC pattern to the resist layer.

2. The method of claim 1, wherein the collecting of the first overlay data from the patterned substrate includes collecting the first overlay data in an inline mode from the patterned substrate when the patterned substrate is secured on one or more alignment wafer stages of the lithography system.

3. The method of claim 2, wherein a number of the alignment wafer stages integrated in the lithography system is chosen such that the collecting of the first overlay data and the performing of the lithography exposing process are substantially matched in terms of processing time without impacting throughput of the lithography exposing process executed by the lithography system.

4. The method of claim 1, wherein
the patterned substrate includes a semiconductor wafer; and
the collecting of the first overlay data from the patterned substrate includes collecting the first overlay data having a full map of alignment marks on the semiconductor wafer.

5. The method of claim 4, wherein the collecting of the first overlay data from the patterned substrate further includes collecting the first overlay data from all intra-field alignment marks and inter-field alignment marks of the semiconductor wafer in an inline mode.

6. The method of claim 1, wherein the performing of the compensation process to the lithography system includes:
adjusting an optical parameter of a projection module of the lithography system; and
performing an overlay compensation by tuning a tilting angle of a mask stage and adjusting clamping force of one or more alignment wafer stages.

7. The method of claim 1, wherein the performing of the compensation process to the lithography system includes determining an overlay compensation and adjusting the lithography system according to the overly compensation such that overlay errors are minimized, wherein the adjusting of the lithography system includes tuning a tilting angle of a mask stage and adjusting clamping force of the mask stage.

8. The method of claim 7, wherein the determining of the overlay compensation includes calculating the overlay compensation using an alignment model, based on displacement differences between the third overlay data and the first overlay data.

9. The method of claim 8, wherein the alignment model associates a system parameter of the lithography system to the overlay errors.

10. The method of claim 9, wherein the alignment model includes intra-field high order process correction that further includes corresponding deviations dXi and dYi along X and Y directions, respectively, wherein the corresponding deviations dXi and dYi are expressed as $$dXi = Tx + Xmag*Xi - Xrot*Yi + ResXi$$

$$dYi = Ty + Ymag*Yi - Yrot*Xi + ResYi$$

where Tx, Xmag, Xrot and ResXi are translations, magnifications, rotations and grid residuals of the X direction, respectively; and Ty, Ymag, Yrot and ResYi are translations, magnifications, rotations and grid residuals for the Y direction a for representative position Xi and Yi, respectively.

11. The method of claim 8, further comprising:
developing the resist layer after the performing of the lithography exposing process to the resist layer; and
performing an overlay measurement for overlay errors between the developed resist layer and the patterned substrate.

12. The method of claim 11, further comprising feeding back the overlay errors to the alignment model to further tune the alignment model.

13. The method of claim 11, further comprising:
feeding back the overlay errors to the alignment model, thereby determining a new overlay compensation; and
adjusting an optical parameter of the lithography system.

14. The method of claim 1, wherein the performing of the lithography exposing process includes performing the lithography exposing process by the lithography system with a radiation source selected from the group consisting of ultraviolet (UV), deep ultraviolet (DUV) and extreme ultraviolet (EUV).

15. A method, comprising:
forming a patterned material layer on a substrate;
coating a resist layer on the patterned material layer;
collecting first overlay data including a full map of all intra field and inter field alignment marks from the patterned material layer in an inline mode;
collecting second overlay data from the patterned material layer in an offline mode;
receiving, from an integrated circuit (IC) pattern database, an IC pattern of a mask;
extracting, directly from the IC pattern database, third overlay data of the IC pattern of the mask;
determining an overlay compensation based on displacement differences between the third overlay data from the IC pattern of the mask and the first overlay data from the patterned material layer using an alignment model;
performing a compensation process to an optical sub-module of a lithography system according to the overlay compensation; and
thereafter performing a lithography exposing process to the resist layer by the lithography system, thereby forming a latent pattern in the resist layer wherein the latent pattern includes the IC pattern.

16. The method of claim 15, wherein the determining of the overlay compensation includes mapping first alignment marks associated with the first overlay data to second alignment marks associated with the third overlay data in a pair for displacement differences.

17. The method of claim 15, wherein
the alignment model includes intra-field high order process correction;
the determining of the overlay compensation includes determining displacement differences between first overlay marks formed in the patterned material layer and second overlay marks defined on the mask, wherein the displacement differences are represented as vectors each having a magnitude and a direction; and
the performing of the compensation process to the optical sub-module of the lithography system according to the overlay compensation includes:
adjusting an optical parameter of a projection module of the lithography system; and
performing an overlay compensation by at least one of tuning a clamping force and a tilting angle of a mask stage securing the mask thereon.

18. A lithography system, comprising:
a radiation source designed to generate a radiation beam for a lithography exposing process;
an optical module to image an integrated circuit (IC) pattern to a semiconductor wafer during the lithography exposing process;
an exposure wafer stage configured to secure the semiconductor wafer for the lithography exposing process;

a plurality of alignment wafer stages integrated with the exposure wafer stage and configured to secure semiconductor substrates for overlay measurement; and an overlay control module that includes:
- an overlay data collector configured to collect first overlay data having a full map of all intra-field and inter-field alignment marks from the semiconductor substrates on the alignment wafer stages, the overlay data collector configured to collect second overlay data from the semiconductor substrates in an offline mode;
- an IC pattern database configured to store the IC pattern defined on a mask, the IC pattern database further configured to enable extraction of third overlay data of the IC pattern defined on the mask;
- an overlay mapping sub-module configured to determine overlay errors using the first overlay data and the third overlay data of the IC pattern defined on the mask;
- an alignment sub-module configured to generate an overlay compensation and feed forward the overlay compensation according to comparison of the first overlay data and third overlay data; and
- a compensation sub-module configured to adjust an optical parameter of the optical module according to the overlay compensation.

19. The lithography system of claim 18, wherein:
the overlay mapping sub-module is configured to determine the overlay errors based on displacement differences between the first overlay data and the third overlay data; and
wherein the compensation sub-module is further configured to control at least one of a tilting angle of the wafer stage and a clamping force of the wafer stage.

20. The lithography system of claim 18, wherein a number of the alignment wafer stages integrated in the lithography system is chosen such that the collecting of the first overlay data and the lithography exposing process are substantially matched in terms of processing time without impacting throughput of the lithography exposing process executed by the lithography system.

* * * * *